United States Patent
Binnard et al.

(10) Patent No.: US 6,686,991 B1
(45) Date of Patent: Feb. 3, 2004

(54) WAFER STAGE ASSEMBLY, SERVO CONTROL SYSTEM, AND METHOD FOR OPERATING THE SAME

(75) Inventors: Michael Binnard, Belmont, CA (US); Toshio Ueta, Redwood City, CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/705,953

(22) Filed: Nov. 6, 2000

(51) Int. Cl.[7] .................. G03B 27/58; G03B 27/42; G03B 27/54; A61N 5/00; G01B 11/00

(52) U.S. Cl. ................. 355/72; 355/53; 355/55; 355/67; 355/77; 250/492.2; 250/492.22; 356/399; 356/400

(58) Field of Search ................ 355/53, 55, 67, 355/72, 77; 250/492.2, 492.22; 356/399, 400

(56) References Cited

U.S. PATENT DOCUMENTS

| | | |
|---|---|---|
| 4,952,858 A | 8/1990 | Galburt |
| 5,661,548 A * | 8/1997 | Imai |
| 5,739,899 A * | 4/1998 | Nishi et al. |
| 5,789,734 A * | 8/1998 | Torigoe et al. |
| 5,917,580 A | 6/1999 | Ebinuma et al. ............ 355/53 |
| 5,917,581 A * | 6/1999 | Suzuki |
| 5,933,215 A | 8/1999 | Inoue et al. ............... 355/53 |
| 6,285,457 B2 | 9/2001 | Ukaji ....................... 356/500 |
| 2002/0054280 A1 | 5/2002 | Tokuda et al. ............. 355/53 |

FOREIGN PATENT DOCUMENTS

WO    WO 01/27978 A1    4/2001

* cited by examiner

Primary Examiner—Frank G. Font
Assistant Examiner—Khaled Brown
(74) Attorney, Agent, or Firm—Finnegan, Henderson, Farabow, Garrett & Dunner, L.L.P.

(57) ABSTRACT

A wafer stage assembly, wafer table servo control system, and method for operating the same, are provided for use in combination with a projection lens assembly in a semiconductor wafer manufacturing process. The wafer stage assembly includes a wafer stage base supporting a wafer stage to position the semiconductor wafer, a wafer table connected to the wafer stage to support the wafer, a plurality of sensors, and an actuator. The sensors include a first sensor to determine a position of an exposure point on the wafer relative to the projection lens assembly, and a second sensor to determine a position of a focal point of the projection lens assembly relative to the exposure point. To increase focusing properties of the projection lens assembly, in response to the determined positions of the exposure point and the focal point, the actuator moves the wafer table so that the exposure point substantially coincides with the focal point. The wafer table servo control system is provided to operate the wafer stage assembly. The servo control system includes a first sensor controller to generate a first position signal of an exposure point on the wafer table relative to a projection lens assembly, and a second sensor controller to generate a second position signal of a focal point of the projection lens assembly relative to the exposure point. The servo control system also includes a wafer table controller to determine and generate a correction force corresponding to the first and second position signals. The correction force is then exerted onto the wafer table to bring the exposure point to substantially coincide with the focal point.

38 Claims, 15 Drawing Sheets

WAFER STAGE ASSEMBLY, SERVO CONTROL SYSTEM, AND METHOD FOR OPERATING THE SAME

BACKGROUND OF THE INVENTION

1. Field of the Invention

This invention relates to a wafer stage assembly, a wafer table servo control system and to a method for operating the same in a photolithography process to manufacture semiconductor wafers. More particularly, this invention relates to the wafer stage assembly, wafer table servo control system and method of operation to increase focusing properties of the photolithography system.

2. Description of the Related Art

In manufacturing integrated circuits using photolithography, an energy beam, such as light, is transmitted through non-opaque portions of a pattern on a reticle, or photomask, through a projection exposure apparatus, and onto a wafer of specially-coated silicon or other semiconductor material. The uncovered portions of the coating that are exposed to light are cured. The uncured coating is then removed by an acid bath. Then, the layer of uncovered silicon is altered to produce one layer of the multi-layered integrated circuit. Conventional systems use visible and ultraviolet light for this process. Recently, however, visible and ultraviolet light have been replaced with electron, x-ray, and laser beams, which permit smaller and more intricate patterns.

As the miniaturization of a circuit pattern progresses, the focus depth of the projection exposure apparatus becomes very small, making it difficult to align accurately the overlay of circuit patterns of the multi-layered integrated circuit. As a result, a primary consideration for an overall design of the photolithography system includes building components of the system that achieve precision by maintaining small tolerances. Any vibration, distortion, or misalignment caused by internal, external or environmental disturbances must be kept at minimum. When these disturbances affect an individual part, the focusing properties of the photolithography system are collectively altered.

FIG. 1 illustrates a conventional exposure apparatus 21 having wafer stage assembly 100 being used in combination with a projection lens system 78 to manufacture semiconductor wafers 68. Wafer table 104 supports a semiconductor wafer 68, while a wafer stage 66 positions a semiconductor wafer 68 as wafer stage 66 is being accelerated by a force (not shown) generated in response to a wafer manufacturing control system (not shown). The wafer manufacturing control system is the central computerized control system executing the wafer manufacturing process.

In operation, exposure apparatus 21 transfers a pattern of an integrated circuit from reticle 80 onto semiconductor wafer 68. Exposure apparatus 21 is mounted to a base 82, i.e., the ground. Apparatus frame 72 is rigid and supports the components of exposure apparatus 21. Apparatus frame 72 supports reticle stage 76, wafer stage 66, lens assembly 78, and illumination system 74.

Different types of photolithographic devices, including a scanning type and a step-and-repeat type, have been used. In the scanning type photolithography system, illumination system 74 exposes the pattern from reticle 80 onto wafer 68 with reticle 80 and wafer 68 moving synchronously. Reticle stage 76 moves reticle 80 on a plane which is generally perpendicular to an optical axis of lens assembly 78, while wafer stage 66 moves wafer 68 on another plane generally perpendicular to the optical axis of lens assembly 78. Scanning of reticle 80 and wafer 68 occurs while reticle 80 and wafer 68 are moving synchronously.

Alternately, in the step-and-repeat type photolithography system, illumination system 74 exposes reticle 80 while reticle 80 and wafer 68 are stationary. Wafer 68 is in a constant position relative to reticle 80 and lens assembly 78 during the exposure of an individual field. Subsequently, between consecutive exposure steps, wafer 68 is consecutively moved by wafer stage 66 perpendicular to the optical axis of lens assembly 78 so that the next field of semiconductor wafer 68 is brought into position relative to lens assembly 78 and reticle 80 for exposure. Following this process, the images on reticle 80 are sequentially exposed onto the fields of wafer 68.

Regardless of the type of photolithography system is used, to focus accurately the image transferred from reticle 80 onto wafer 68, exposure apparatus 21 must align a position of an exposure point on wafer 68 with a position of a focal point of projection lens system 78. An auto-focus and auto-leveling (AF/AL) sensor (not shown) can determine the focal point position relative to the exposure point. However, the AF/AL sensor generally has several limitations, including, first, it only operates when wafer 68 is placed directly under projection lens assembly 78, and second, it requires significant signal processing causing a delay in generating an output. Furthermore, the AF/AL sensor measures the wafer surface, so the output of AF/AL sensor does not exactly measure the actual motion of wafer table 104. Hence, AF/AL sensor 114 is not sufficient for high bandwidth control of the wafer table 104.

In light of the foregoing, there is a need for an improved sensor for use in ombination with the AF/AL sensor, which can determine the position of the focal point relative to the exposure point with high bandwidth at all locations of wafer stage 66.

SUMMARY OF THE INVENTION

The advantages and purposes of the invention will be set forth in part in the description which follows, and in part will be obvious from the description, or may be learned by practice of the invention. The advantages and purposes of the invention will be realized and attained by the elements and combinations particularly pointed out in the appended claims.

To attain the advantages and consistent with the principles of the invention, as embodied and broadly described herein, one aspect of the invention is a stage assembly for use in combination with a projection optical assembly in a photolithography process for making a substrate. The stage assembly comprises a stage that positions the substrate, a stage base that supports the stage, and a table connected to the stage to support the substrate. The stage assembly also comprises a first sensor that determines a position of an exposure point on the table relative to the projection optical assembly, a second sensor that determines a position of a focal point of the projection optical assembly relative to the exposure point, and an actuator that moves the table so that the exposure point substantially coincides with the focal point.

A second aspect of the present invention is a method for determining a position of a table relative to a projection optical assembly in a semiconductor substrate manufacturing device. The table is supported by a stage and a stage base. The method comprises the steps of determining a position of the stage base relative to the projection optical assembly, determining a position of the stage relative to the stage base, and determining a position of the table relative to the stage.

A third aspect of the present invention is a table servo control system of a stage assembly having a stage base for supporting a stage and positioning a semiconductor substrate. A table is connected to the stage for supporting the substrate. The table servo control system comprises a first sensor controller to generate a first position signal of an exposure point on the table relative to a projection optical assembly, and a second sensor controller to generate a second position signal of a focal point of the projection optical assembly relative to the exposure point. The table servo control system also comprises a table controller to determine a correction force corresponding to the first and second position signals, the correction force being exerted on the table to bring the exposure point to substantially coincide with the focal point.

A fourth aspect of the present invention is a method for operating a table servo control system of a stage assembly. The method comprises the steps of creating a first loop to generate a first position signal of an exposure point on a table relative a projection optical system, creating a second loop to generate a second position signal of a focal point of the projection optical system relative to the exposure point, and exerting a correction force, in response to the first and second position signals, onto the table to bring the exposure point to substantially coincide with the focal point.

It is to be understood that both the foregoing general description and the following detailed description are exemplary and explanatory only and are not restrictive of the invention as claimed. Additional advantages will be set forth in the description which follows, and in part will be understood from the description, or may be learned by practice of the invention. The advantages and purposes may be obtained by means of the combinations set forth in the attached claims.

BRIEF DESCRIPTION OF THE DRAWINGS

The accompanying drawings, which are incorporated in and constitute a part of this specification, illustrate several embodiments of the invention and, together with the description, serve to explain the principles of the invention. In the drawings.

DESCRIPTION OF THE INVENTION

Reference will now be made in detail to several embodiments of device, system, and method consistent with the principles of the present invention, examples of which are illustrated in the accompanying drawings. The invention will be further clarified by the following examples, which are intended to be exemplary of the invention.

Figure 1:
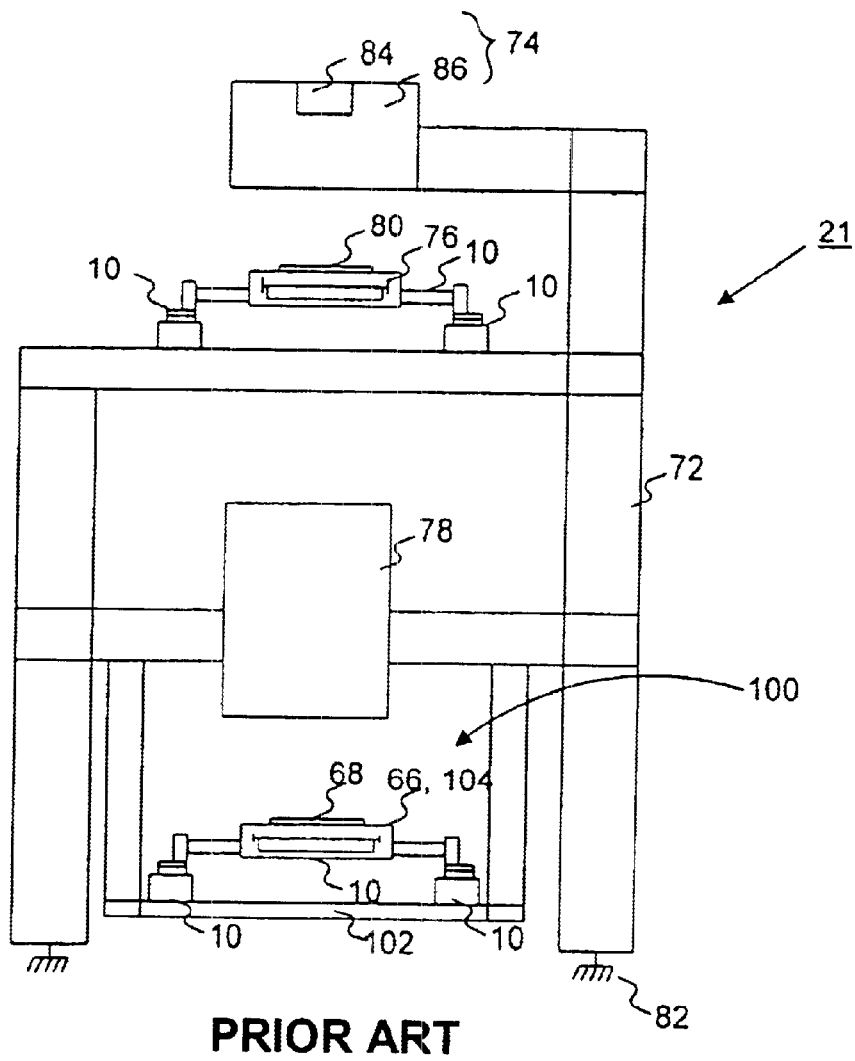
FIG. 1 is an elevation view of a conventional exposure apparatus having a wafer stage assembly.
Figure 2:
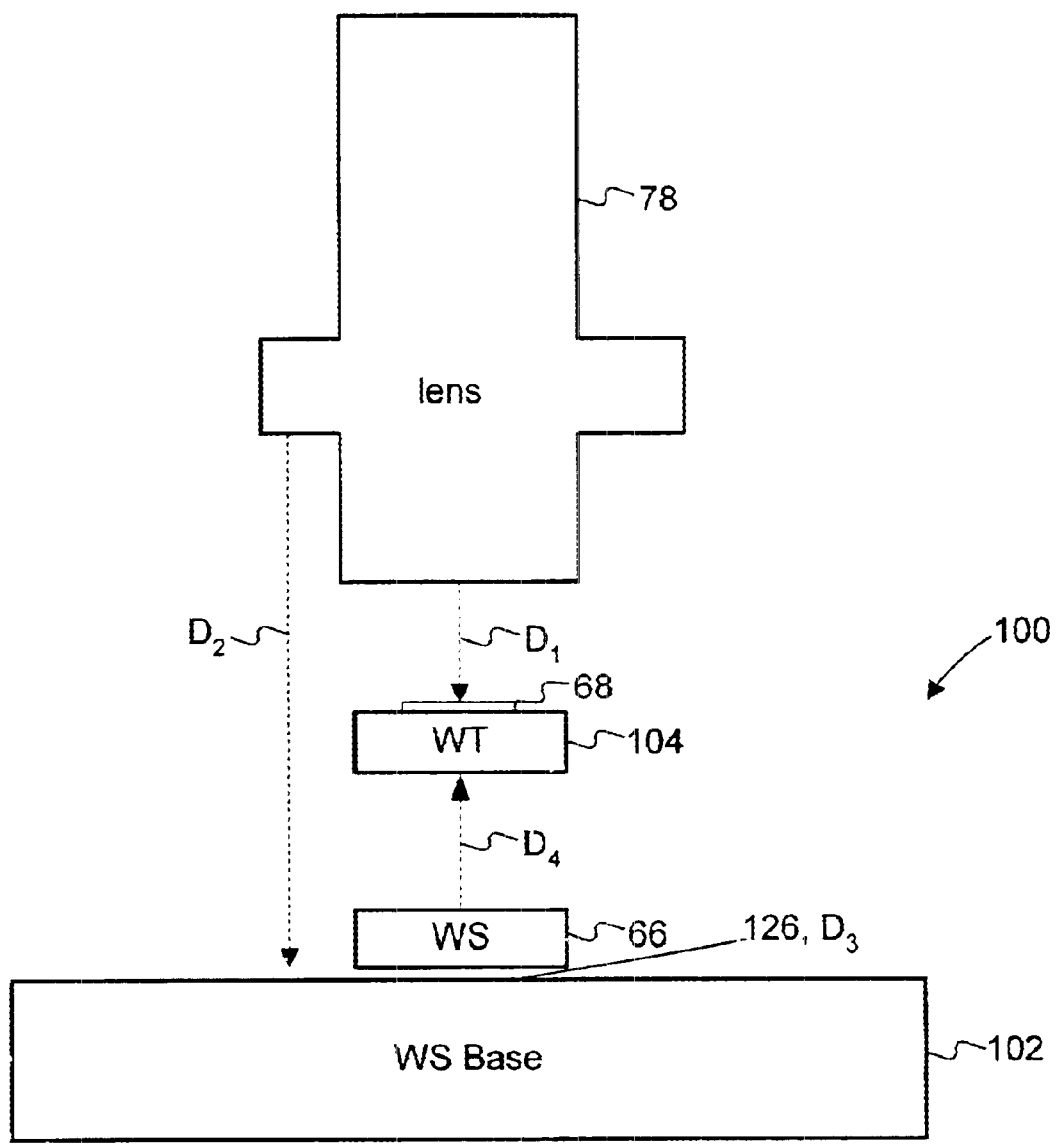
FIG. 2 is a schematic diagram of one embodiment a wafer stage assembly and a method of measuring a wafer table relative to a projection lens assembly consistent with the principles of the present invention.
Figure 3:
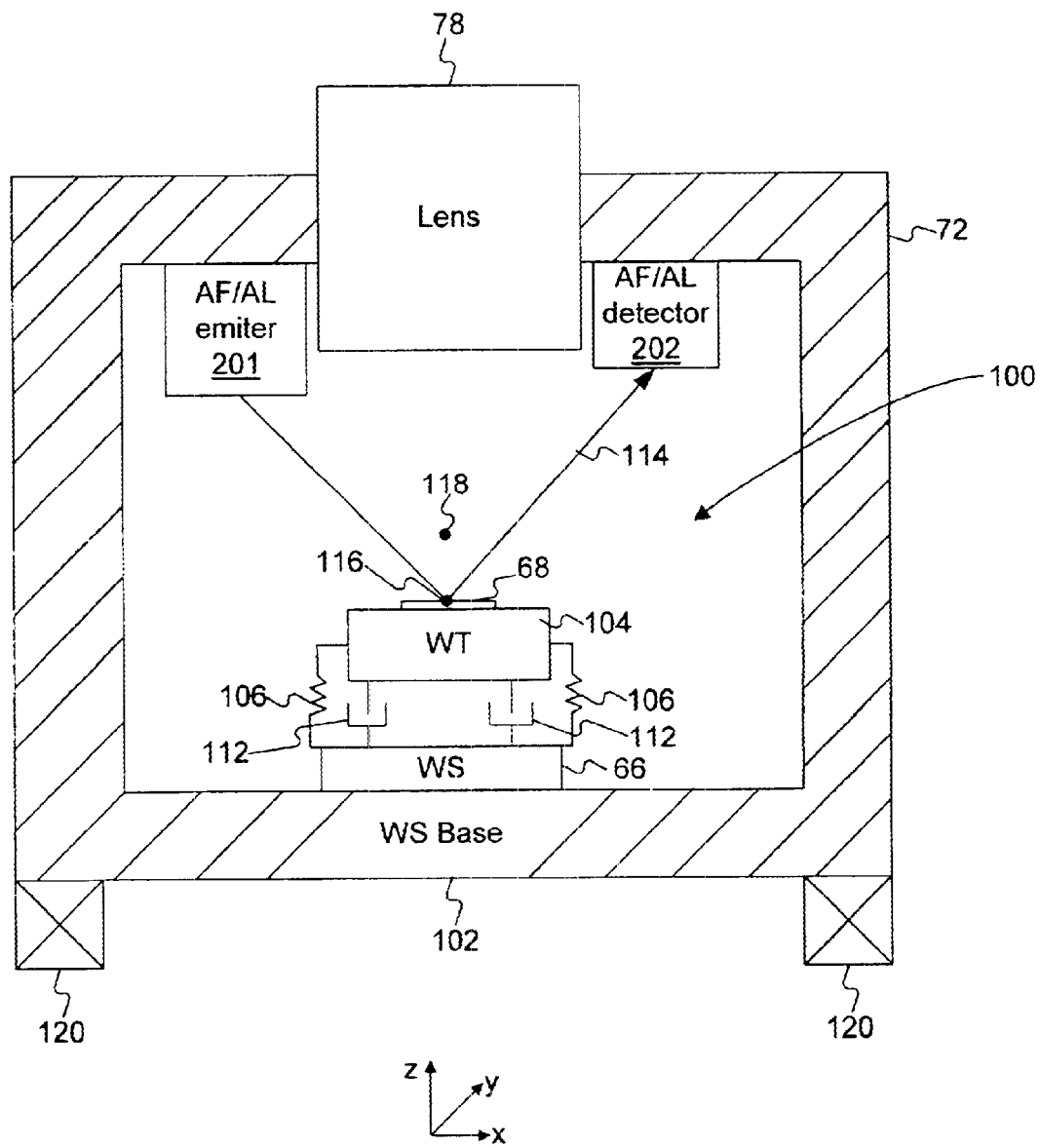
FIG. 3 is a schematic of the wafer stage assembly consistent with the principles of the present invention.
Figure 4:
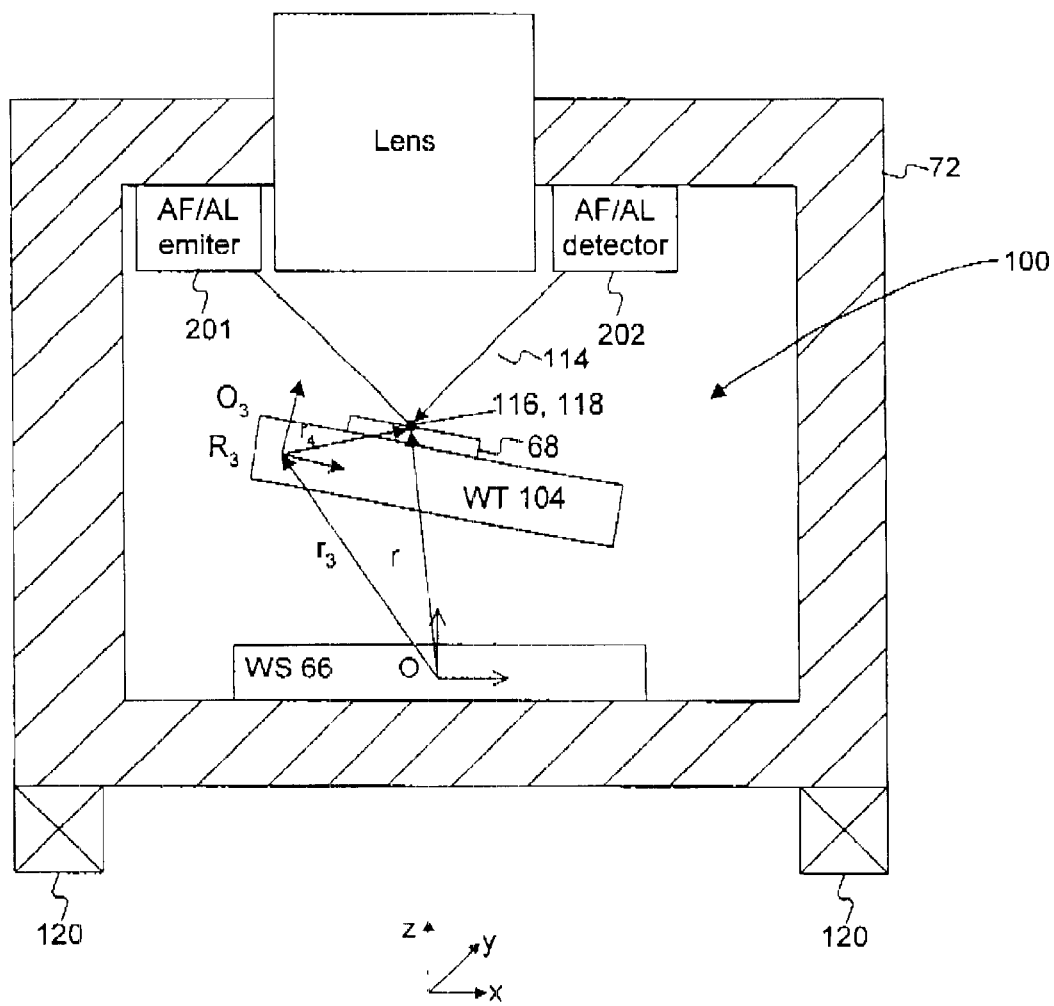
FIG. 4 is a diagram of positional relations of elements according to the wafer stage assembly consistent with the principles of the present invention.

Consistent with the principles of the present invention, and as shown in FIGS. 2–4, a wafer stage assembly 100 includes a wafer table 104 to support a wafer substrate 68, a wafer stage 66, and a wafer stage base 102. Wafer stage base 102 supports wafer stage 66. A bearing 126 of pressurized fluid separates wafer stage 66 from wafer stage base 102. A set of flexures 106 connects wafer table 104 to wafer stage 66.

FIGS. 2–4 illustrate a unibody system whereby apparatus frame 72 rigidly supports wafer stage assembly 100 and projection lens system 78. A vibration isolation system 120 is provided to isolate apparatus frame 72 from internal, external, and environmental disturbances.

At least one encoders 112 (two are schematically shown in FIG. 3) are provided to determine the position of the wafer table 104 relative to wafer stage 66. Encoders 112 are used in combination with an AF/AL sensor 114 which comprises an AF/AL emitter 201 and AF/AL detector 202. A control system, such as a wafer manufacturing control system (not shown), provides the position of exposure point 116 relative wafer 68. As best shown in FIG. 2, exposure apparatus 21 need to determine the position ($D_1$) of wafer table 104 relative to projection lens system 78.

In a unibody structure as shown in FIGS. 2–4, wafer stage base 102 is rigidly connected to projection lens assembly 78 providing a constant position ($D_2$) of wafer stage base 102 relative to projection lens assembly 78. A fixed position of wafer stage base 102 provides a reference point for measuring its position relative to projection lens assembly 78.

Wafer stage 66 rides on wafer stage base 102 via a bearing 126, such as an air bearing, which is a thin layer of pressurized air allowing wafer stage 66 to move along the z axis as the thickness of air layer changes. In practice, air bearing 126 acts like a stiff spring, so the vertical distance between wafer stage 66 and wafer stage base 102, commonly referred to as flying height of wafer stage 66, is basically a constant $D_3$.

A plurality of encoders 112 determine a position of wafer table 104 relative to wafer stage 66 ($D_4$). Encoders 112 do not account for the varying flying height of wafer stage 66, nor other structural deformation in exposure apparatus 21 that causes a change in the vertical position between wafer stage 66 and projection lens system 78.

Thus, the position of wafer table 104 relative to projection lens assembly 78 along the z axis ($D_1$) can be mathematically expressed according to the formula:

$$D_1 = D_2 - D_3 - D_4 \tag{Eq.1}$$

whereby, $D_2$ is the position of wafer stage base 102 relative to projection lens assembly 78, $D_3$ is the air bearing flying height, and $D_4$ is the position of wafer table 104 relative to wafer stage 66.

In reality, the positions of wafer table 104 and wafer stage 66 relative to wafer stage base 102 and projection lens assembly 78 may not be properly aligned along the z axis as shown in FIGS. 2 and 3. FIG. 4 illustrates, in exaggeration for exemplary purposes, wafer table 104 being angularly positioned relative to wafer stage 66 and wafer stage base 102. According to this configuration, encoders 112 measure a vector $r_3$ between wafer stage 66 and wafer table 104, and a coordinate rotation $R_3$ of wafer table 104 relative to wafer stage 66. Coordinate rotation $R_3$ is based on a coordinate frame O attached to wafer stage 66, which is subsequently attached to coordinate frame of apparatus frame 72, including projection lens assembly 78.

An input controller (not shown), which is either connected to or a part of the wafer manufacturing control system, predetermines the position of exposure point 116 on wafer 68 at any given time to be exposed to the energy beam. The input controller generates the predetermined position vector $r_4$ between the origin of coordinate frame $O_3$ (attached to wafer table 104) and exposure point 116. There is no rotation involved between exposure point 116 and wafer table 104 because wafer 68 is securely held in place by fastening means, such as vacuum, onto wafer table 104. Therefore, vector r, representing the position and orientation of exposure point 116 relative to wafer stage 66 or projection lens assembly 78, is the logical sum of vector $r_4$ with rotation $R_3$ based on coordinate $O_3$ and vector $r_3$ with no rotation based on coordinate frame O. The mathematical relation of vector r can be expressed as follows:

$$r = r_3 + R_3 \cdot r_4 \tag{Eq. 2}$$

A wafer table control system (not shown) is structured as an inner loop and an outer loop. The inner loop uses signals from encoders 112 to create a high-bandwidth loop for controlling vector r as calculated using the mathematical formula provided above. The reference signal for the inner loop is determined by AF/AL sensor 114, which creates a lower-bandwidth outer loop. Using the output of AF/AL sensor 114 indicating the position of focal point 118 relative to exposure point 116, and vector r indicating the position of exposure point 116 on wafer table 104 relative to wafer stage 66 or apparatus frame 72, a force signal (not shown) is generated to move wafer table 104 to bring exposure point 116 to substantially coincide with focal point 118.

Figure 5:
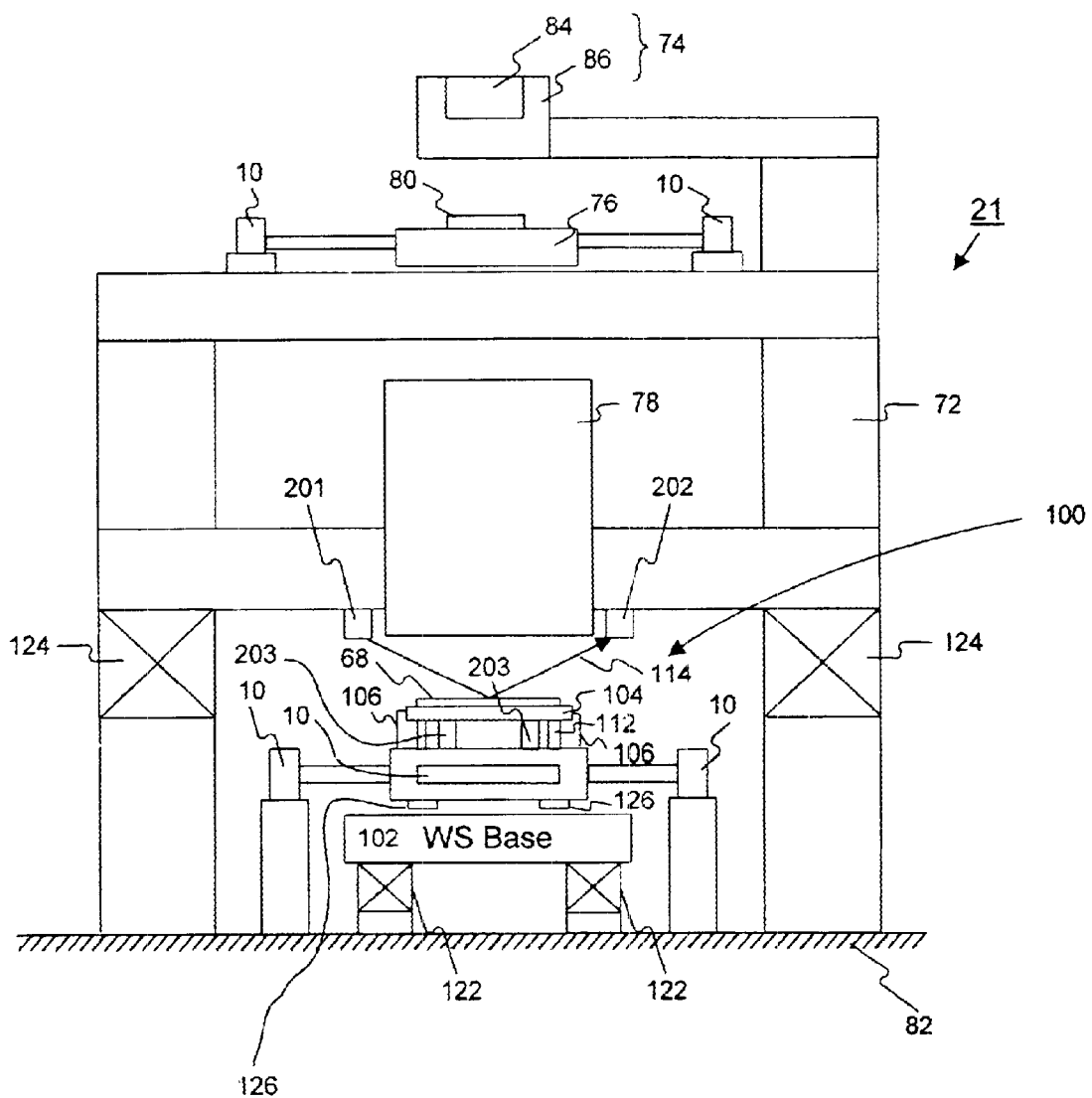
FIG. 5 is an elevation view of an exposure apparatus having another embodiment of a wafer stage assembly consistent with the principles of the present invention.

In another embodiment, as shown in FIG. 5, a photolithography system has been proposed which has a multi-body structure in which wafer stage assembly 100 is supported by a first vibration isolation system 122, while projection lens system 78 is supported by a second vibration isolation system 124, separate from the first vibration isolation system 122. The position of wafer stage base 102 relative to projection lens system 78 varies as the first and second vibration isolation systems, 122 and 124, respectively, move relative to each other. Therefore, in the multi-body structure, wafer stage base 102 is no longer fixed in position relative to projection lens assembly 78.

First and second vibration isolation systems, 122 and 124, respectively, are described in further detail in U.S. patent application Ser. No. 09/662,840 the disclosure of which is incorporated herein by reference in the entirety.

Figure 6:
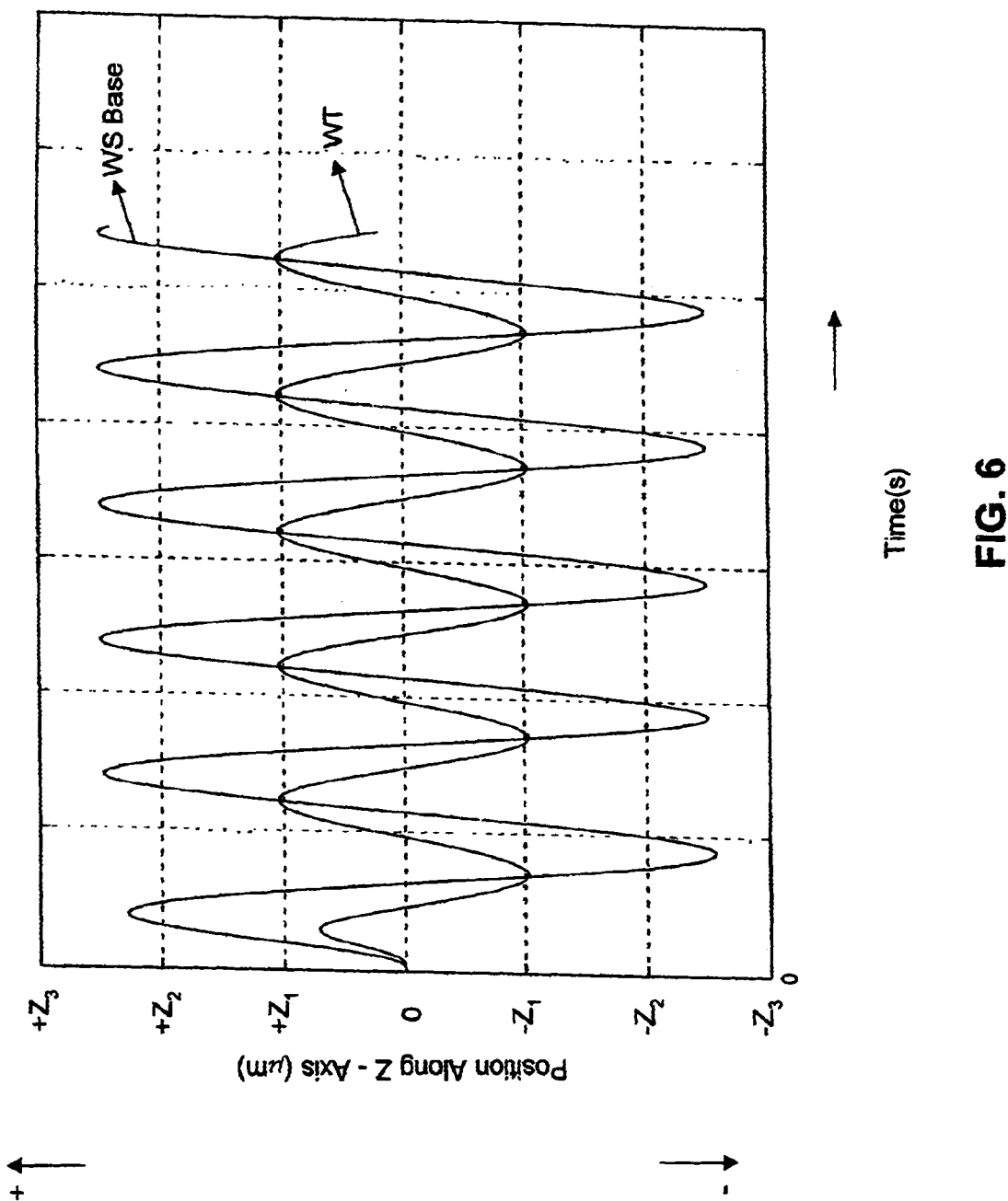
FIG. 6 is a chart of positions of a wafer table in response to an oscillating motion of a wafer stage base along the z axis, generated according to a simulation of a multi-body lithography structure with the conventional wafer stage assembly and control system.
Figure 7:
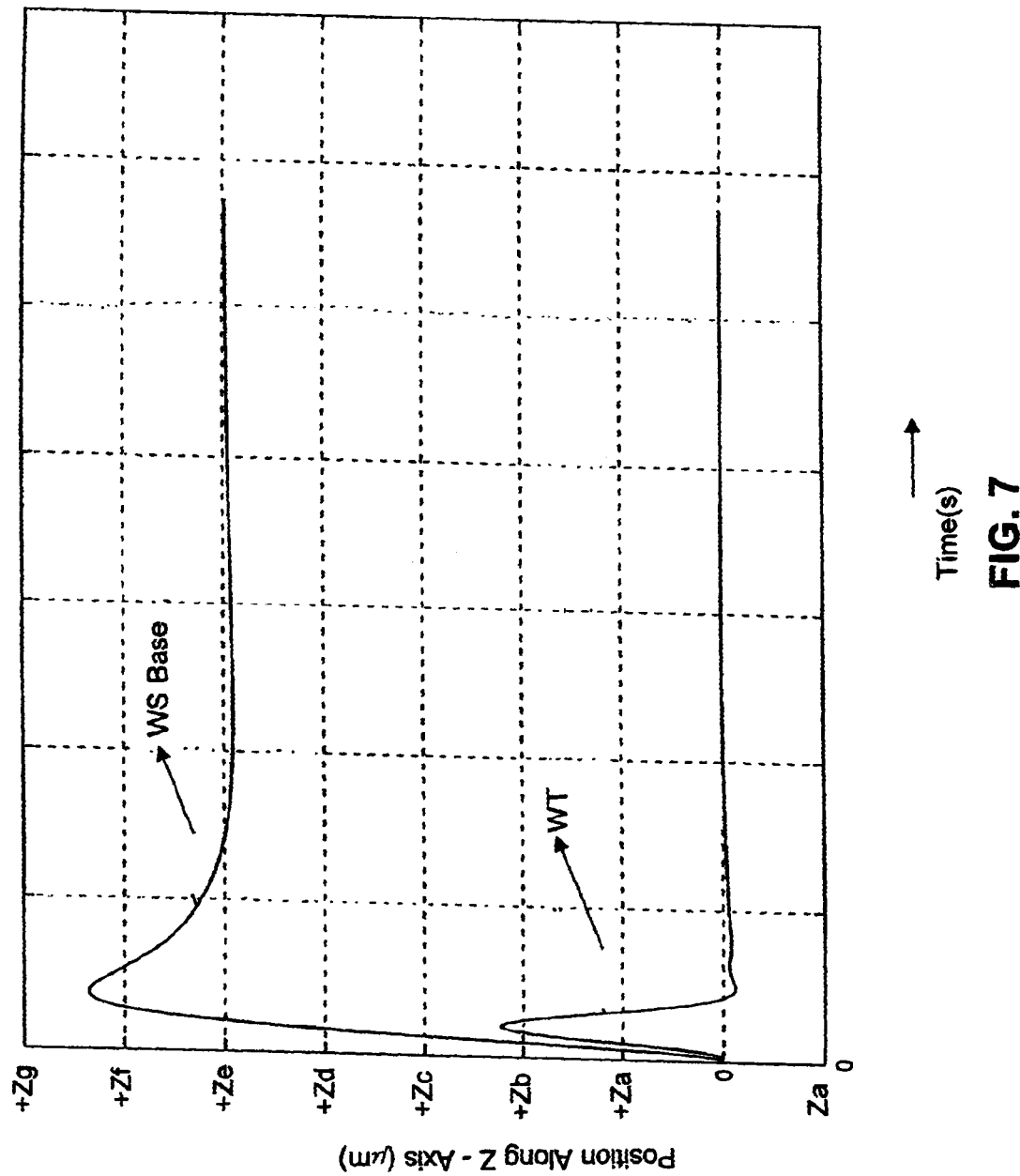
FIG. 7 is a chart of positions of a wafer table in response to a step motion of a wafer stage base along the z axis, generated according to a simulation of a multi-body lithography structure with the conventional wafer stage assembly and control system.

FIGS. 6 and 7 show the results of a simulation of wafer stage assembly 200 attached to the multi-body structure, but utilizing the method described above for determining the position of exposure point 116 wafer stage base 102 relative to projection lens system 78. FIG. 6 represents the position of wafer table 104, along the z axis, in response to an oscillating motion of wafer stage base 102 measured in micrometers ($\mu$m) over a period of time measured in seconds (s). FIG. 7 represents the position of wafer table 104, along the z axis, in response to a step motion of wafer stage base 102 measured in micrometers ($\mu$m) over a period of time measured in seconds (s). This simulation shows that the oscillating or step motion of wafer stage base 102 greatly affects the position of wafer table 104, which subsequently causes errors in the position of exposure point 116 relative to projection lens system 78.

Also consistent with the principles of the present invention, it is provided a wafer stage device, a wafer stage servo control system, a method for determining the position of the exposure point relative to the projection lens system, and a method for operating the wafer table servo control system allowing a relative motion between the wafer stage base and the projection lens assembly in a multi-body photolithography structure. In addition, since the AF/AL sensor operates with several limitations, the principles of the present invention are also directed to an alternate or a supplemental sensor that operates on a higher bandwidth and works even when the wafer is not positioned directly under the projection lens assembly.

A wafer stage assembly, wafer table servo control system, and method of operating the same, consistent with the principles of this invention, are useful to determine a position of an exposure point on a wafer table relative to a projection lens assembly and its focal point, so that the wafer table can be positioned to close the distance between the exposure point and the focal point to accurately focus an image transferred from a reticle onto a semiconductor wafer.

This invention is not limited to any particular application, rather, the device, control system, and method disclosed herein could be used in any system configured to embody similar elements. For example, the principles of the present invention may also be used to measure the position of the wafer table relative to the wafer stage base. In addition, the position of the wafer table in some degrees of freedom can be measured relative to the projection lens assembly, while the position in other degrees of freedom can be measured relative to the wafer stage or stage base. Although the principles of the present invention are useful for a photolithography device having a multi-body structure, the same principles may also be applied in a photolithography device having a unibody structure.

Figure 8:
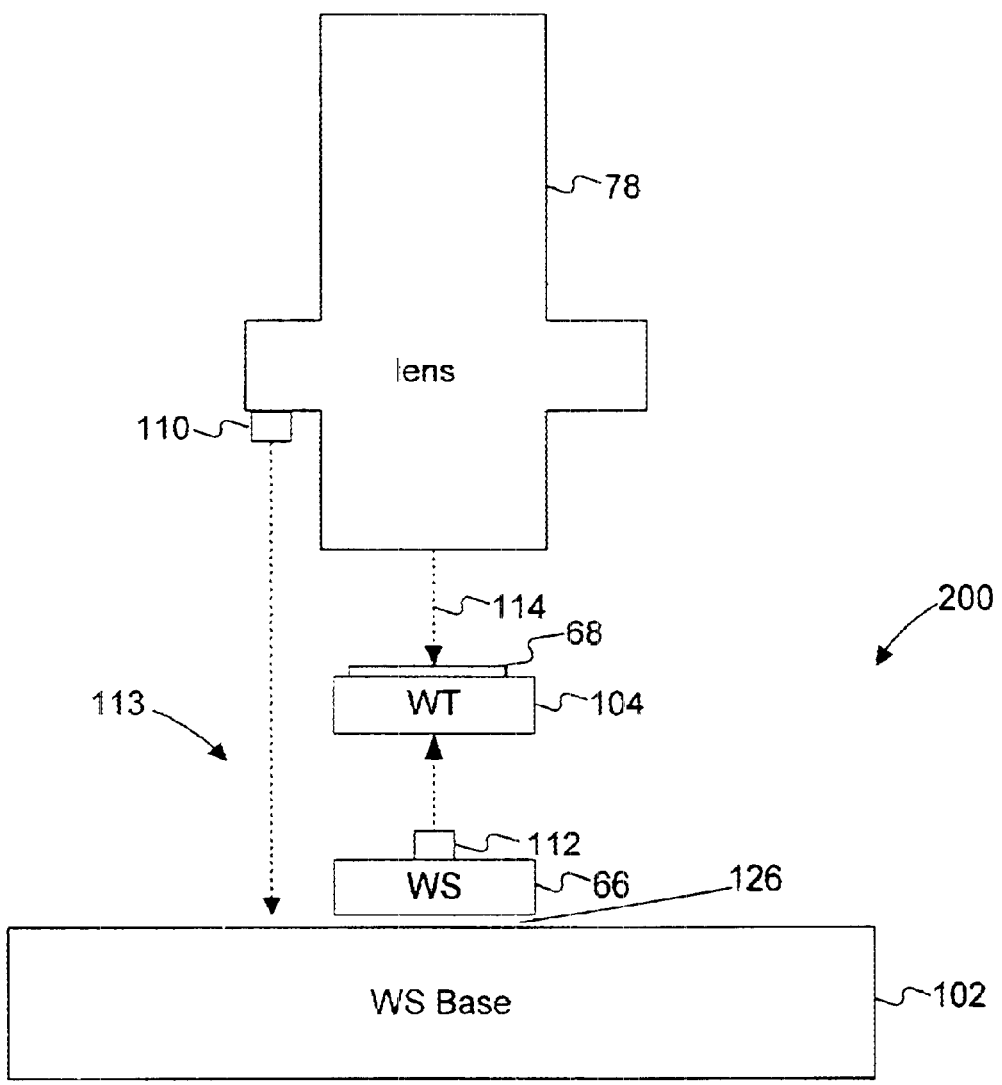
FIG. 8 a schematic diagram of a wafer stage assembly and a method of measuring a wafer table relative to a projection lens assembly consistent with the principles of the present invention.

A wafer stage assembly 200, consistent with the principles of the present invention, and as diagrammatically illustrated in FIG. 8, includes a wafer table 104 for supporting a semiconductor wafer 68 and a wafer stage 66 for positioning wafer 68 as wafer stage 66 is accelerated by a force (not shown) generated in response to a wafer manufacturing control system (not shown). Wafer stage assembly 200 also includes a wafer stage base 102 for supporting wafer stage 66. A bearing 126 separates wafer stage 66 from wafer stage base 102.

Figure 9:
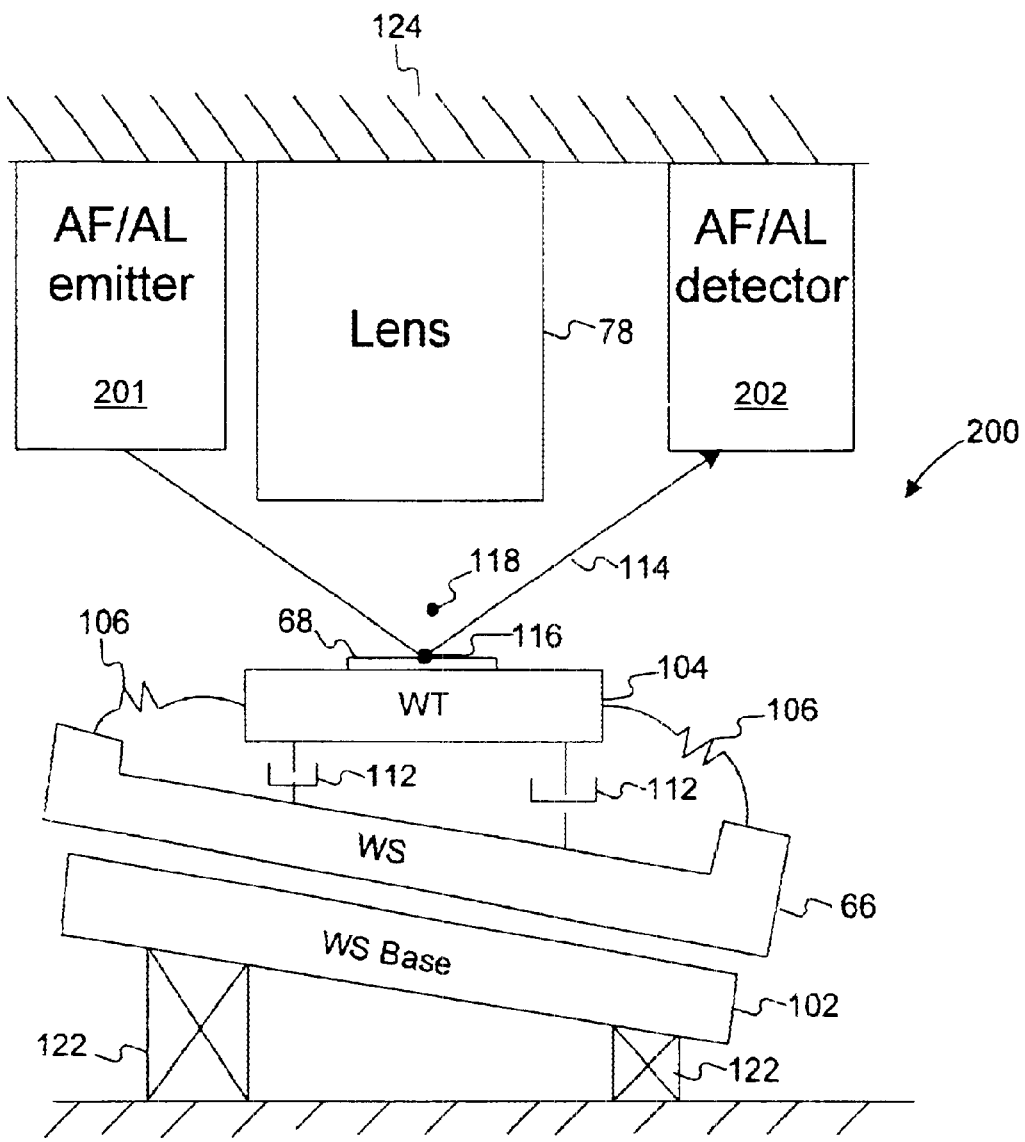
FIG. 9 is a schematic of the wafer stage assembly consistent with the principles of the present invention.

FIG. 9 illustrates a multi-body photolithography system whereby wafer stage base 102 is supported by a first vibration isolation system 122, while projection lens assembly 78 is supported by a second vibration isolation system 124, separate from first vibration isolation system 122.

A set of flexures 106 connects wafer table 104 to wafer stage 66 to support wafer table 104. If viewed downward along the z axis, wafer stage 66 and wafer table 104 may have a circular configuration, substantially concentrically arranged, and a plurality of flexures 106 being distributed around the concentric configuration connecting wafer table 104 to wafer stage 66. Flexures 106 are preferably capable of resisting planar motion between wafer table 104 and wafer stage 66 along the x and y axes, while allowing vertical motion along the z axis. Flexures 106 are preferably made of steel, and may be any type of commercially available flexures.

Consistent with the principles of the present invention, and as shown in FIG. 8, wafer stage assembly 200 has a first sensor, diagrammatically referred to as reference number 113, to determine a position of wafer table 104 relative to projection lens assembly 78, and a second sensor, diagrammatically referred to as reference number 114, such as an AF/AL sensor, to determine a position of a focal point 118 of projection lens assembly 78 relative to an exposure point 116 on wafer 68.

As shown in FIG. 8, first sensor 113 may include a plurality of sensors, such as, a first sub-sensor 110 and a second sub-sensor 112, to measure in incremental segments the distance and orientation of wafer table 104 relative to projection lens assembly 78.

Figure 10:
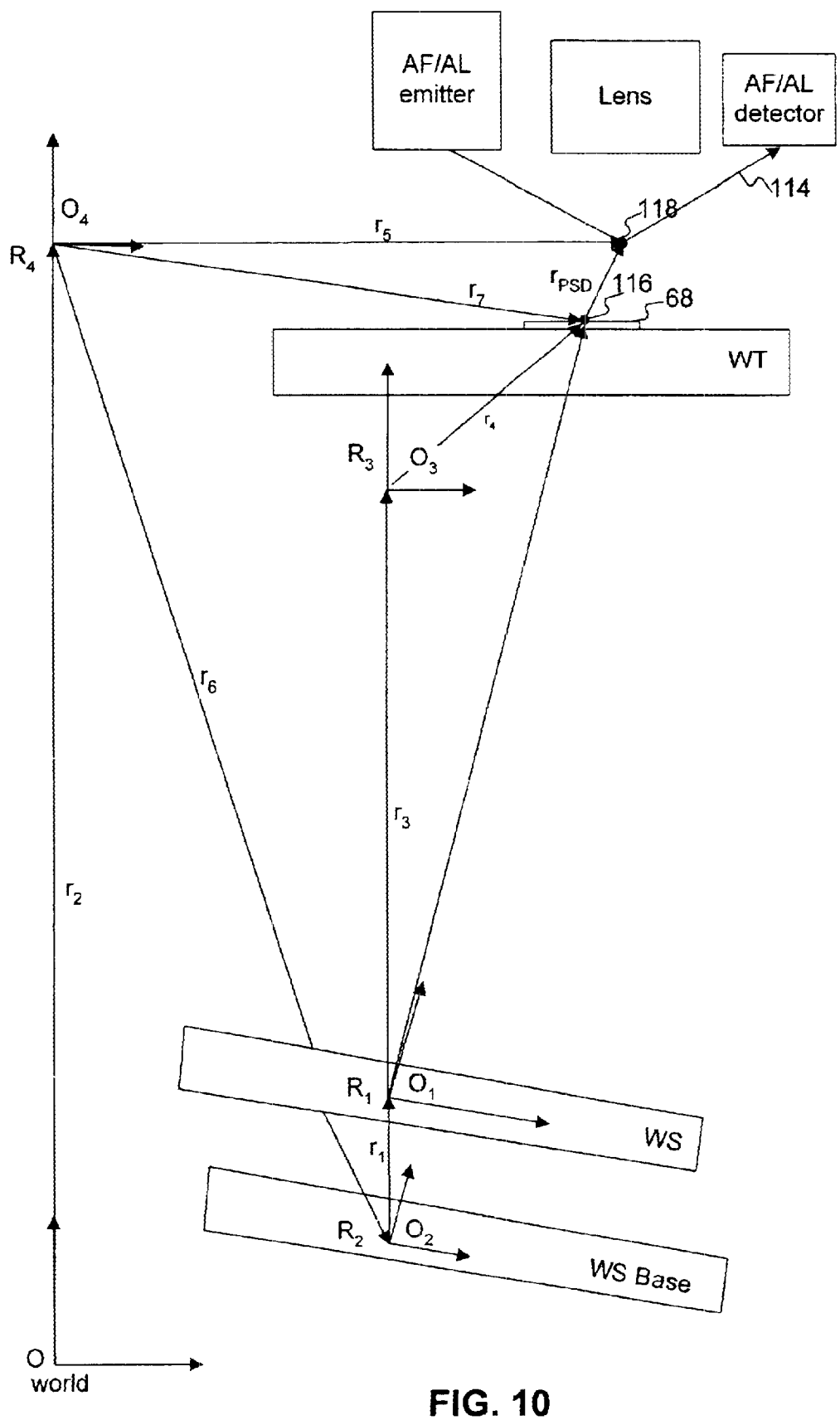
FIG. 10 is a diagram of positional relations of elements according to the wafer stage assembly consistent with the principles of the present invention.

As illustrated in FIG. 10, first sub-sensor 110 measures a position vector $r_6$ and a coordinate rotation $R_2$ of wafer stage base 102 based on a coordinate frame $O_4$ relative to projection lens assembly 78. Coordinate frame $O_4$ is a coordinate frame attached to projection lens assembly 78 relative to the inertial reference frame O. First sub-sensor 110 may be an interferometer, such as the type generally used in the photolithography art or the type commercially available. First sub-sensor 110 may also be any equivalent sensors capable of measuring a distance and a rotation of wafer stage base 102 relative to projection lens assembly 78. In the embodiment shown in FIG. 10, first sub-sensor 110 includes at least a set of three interferometers (high resolutions sensors) disposed separately between one another.

First sensor 113 also includes a second sub-sensor 112 to measure a position vector $r_3$ and a coordinate rotation $R_3$ of wafer table 104 based on a coordinate frame $O_1$ relative to wafer stage 66. Coordinate frame $O_1$ is a coordinate frame attached to wafer stage 66. For example, second sub-sensor 112 may be a set of three encoders, one encoder to measure the distance along the z axis, one to measure the rotation around the x axis, and another one to measure the rotation around the y axis. The encoders may be the type generally used in the photolithography art or commercially available encoders. Second sub-sensor 112 may also be any equivalent sensor(s) capable of measuring the distance and rotation of wafer table 104 relative to wafer stage 66.

Further, in the embodiment illustrated in FIGS. 8–10, first sensor 113 may include a third sub-sensor (not shown) to measure a position vector $r_1$ and a coordinate rotation $R_1$ of wafer stage 66 based on a coordinate frame $O_2$ relative to wafer stage base 102. Coordinate frame $O_2$ is a coordinate frame attached to wafer stage base 102.

Alternatively, the third sub-sensor may be replaced with a first input controller (not shown) to provide a calculated signal when vector $r_1$ is a constant or known vector. Bearing 126 may be pressurized fluid, such as, a thin layer of compressed air allowing wafer stage 66 to move as the thickness of air layer changes. In practice, air bearing 126 acts like a stiff spring, so the vertical distance between wafer stage 66 and wafer stage base 102 is basically constant, i.e., vector $r_1$ is a constant along the z axis. The first input controller determines the first known value and generates the first input signal.

First sensor 113 may include a fourth sub-sensor (not shown) to measure a distance of vector $r_4$, based on coordinate frame $O_3$, of exposure point 116 on wafer table 104. Coordinate frame $O_3$ is a coordinate frame attached to wafer table 104. The orientation of wafer 68 is the same as the orientation of wafer table 104 because wafer 68 is securely held in place by fastening means, such as, vacuum, onto wafer table 104.

In practice, another input controller, either connected to or a part of the wafer manufacturing control system, predetermines the positions of exposure points 116 on wafer 68 at any given time to be exposed to the energy beam. Therefore, the fourth sub-sensor may be replaced with a second input controller (not shown) to determine the second known value at a particular point of time and generate the second input signal.

Alternatively, first sensor 113 may be a single sensor or a set of sensors (not shown) to measure the overall distance and orientation of wafer table 104 relative to projection lens assembly 78. For example, the sensor(s) may include an interferometer attached to projection lens assembly 78 and a reflective surface attached to wafer table 104 to bounce off the objective light emitted by the interferometer in determining the distance and orientation of wafer table 104 relative to projection lens assembly 78. The interferometer may be any type of interferometers commercially available and well known in the field of optics.

FIGS. 8–10 further show second sensor 114 being an AF/AL sensor, which is a relative sensor to determine vector $r_{PSD}$ representing the position of focal point 118 relative to exposure point 116. PSD is an abbreviation for position sensitive detector, a common term used by people generally involved in the field of AF/AL sensors. The AF/AL sensor may be the type generally used in the photolithography art or a commercially available AF/AL sensor. Alternatively, a sensor equivalent to AF/AL sensor may be used to determine vector $r_{PSD}$.

Position vectors $r_1$–$r_7$ and coordinate rotations $R_1$–$R_4$ can be calculated using a mathematical matrix transformation. The following example shows the matrix calculation to measure the position vector $r_3$ and coordinate rotation $R_3$ between wafer table 104 and wafer stage 66. The position and orientation of wafer table 104 relative to wafer stage 66 is measured by second sub-sensor 112. According to one embodiment, second sub-sensor 112 may be a set of six encoders. Each encoder measures one degree of freedom of a measurement point attached to wafer table 104. The six encoders return measurement values of E1, E2, E3, E4, E5, and E6. Each of measurement value E1–E6 correspond with a position measurement in the XYZ coordinate. That is:

E1 having a position coordinate of (X1, Y1, Z1);
E2 having a position coordinate of (X2, Y2, Z2);
E3 having a position coordinate of (X3, Y3, Z3);
E4 having a position coordinate of (X4, Y4, Z4);
E5 having a position coordinate of (X5, Y5, Z5); and
E6 having a position coordinate of (X6, Y6, Z6).

In the exemplified embodiment, encoder E1 measures wafer table 104 in the x direction; encoders E2 and E3 measure wafer table 104 in the y direction; and encoders E4, E5, and E6 measure wafer table 104 in the z direction. In other embodiments, a different combination of sensor orientations are possible, but the same matrix calculation procedure applies.

The position vector $r_3$ (X, Y, Z) is the position of the center of gravity of wafer table 104 relative to wafer stage 66 in the XYZ coordinate, while the coordinate rotation $R_3$ ($\theta_x$, $\theta_y$, $\theta_z$) is the rotation of wafer table 104 relative to wafer stage 66. For this example, rotation angles around the x, y, and z axes ($\theta_x$, $\theta_y$, $\theta_z$) of wafer table 104 are assumed to be small angles.

The following matrix relates to the encoder measurements E1–E6 to the position $r_3$ and orientation $R_3$ of wafer table 104:

$$\begin{Bmatrix} E1 \\ E2 \\ E3 \\ E4 \\ E5 \\ E6 \end{Bmatrix} = \begin{bmatrix} 1 & 0 & 0 & 0 & Z1 & -Y1 \\ 0 & 1 & 0 & -Z2 & 0 & X2 \\ 0 & 1 & 0 & -Z3 & 0 & X3 \\ 0 & 0 & 1 & Y4 & -X4 & 0 \\ 0 & 0 & 1 & Y5 & -X5 & 0 \\ 0 & 0 & 1 & Y6 & -X6 & 0 \end{bmatrix} \begin{Bmatrix} X \\ Y \\ Z \\ \theta x \\ \theta y \\ \theta z \end{Bmatrix} \quad \text{(Eq. 3)}$$

Thus, the above matrix is inversed to calculate the position $r_3$ and orientation $R_3$ based on the known encoder measurements E1–E6, as follows:

$$\begin{Bmatrix} X \\ Y \\ Z \\ \theta x \\ \theta y \\ \theta z \end{Bmatrix} = \begin{bmatrix} 1 & 0 & 0 & 0 & Z1 & -Y1 \\ 0 & 1 & 0 & -Z2 & 0 & X2 \\ 0 & 1 & 0 & -Z3 & 0 & X3 \\ 0 & 0 & 1 & Y4 & -X4 & 0 \\ 0 & 0 & 1 & Y5 & -X5 & 0 \\ 0 & 0 & 1 & Y6 & -X6 & 0 \end{bmatrix}^{-1} \begin{Bmatrix} E1 \\ E2 \\ E3 \\ E4 \\ E5 \\ E6 \end{Bmatrix} \quad \text{(Eq. 4)}$$

Therefore, the position vector $r_3$ and rotation coordinate $R_3$ are mathematically referred to as:

$$r_3 = \begin{Bmatrix} X \\ Y \\ Z \end{Bmatrix} \quad \text{(Eq. 5)}$$

$$R_3 = \begin{bmatrix} 1 & -\theta z & \theta y \\ \theta z & 1 & -\theta x \\ -\theta y & \theta x & 1 \end{bmatrix} \quad \text{(Eq. 6)}$$

The following teaches how to measure the position vector $r_6$ (X, Y, Z) and coordinate rotation $R_2$ ($\theta_x$, $\theta_y$, $\theta_z$) of wafer stage base 102 relative to projection lens assembly 78. There are at least four alternatives to determine the position and orientation of wafer stage base 102 relative to lens assembly 78 as measured by first sub-sensor 110. First option, first sub-sensor 110 comprises a set of six high resolution sensors, such as interferometers or other equivalent sensors, to measure each degree of freedom. Second option, first sub-sensor 110 comprises a set of three high resolution sensors to measure three degrees of freedom, i.e., Z, $\theta_x$, and $\theta_y$, while treating X, Y, and $\theta_z$, as constant values. Third option, first sub-sensor 110 comprises a set of three high resolution sensors to measure three degrees of freedom in Z, $\theta_x$, and $\theta_y$, and uses measurement values from first and second vibration isolation systems, 122 and 124, respectively (shown in FIG. 5), to calculate X, Y, and $\theta_z$. Fourth option, first sub-sensor 110 comprises a set of three high resolution sensors to measure three degrees of freedom in Z, $\theta_x$, and $\theta_y$, and a set of three low resolution sensors, to measure the other three degrees of freedom in X, Y, and $\theta_z$. Low resolution sensors may be, for example, capacitance probes, sensors provided in first and second vibration isolation systems, 122 and 124, respectively, or equivalent sensors.

According to the first option, the matrix calculation procedure to determine position vector $r_6$ and coordinate rotation $R_2$ between wafer stage base 102 and lens assembly 78 is the same as formulae (3)–(6) previously described with respect to position vector $r_3$ and coordinate rotation $R_3$.

According to the second option, since wafer stage base 102 generally moves very slightly due to accurately controlled wafer stage 66 in X, Y, and $\theta_z$. As a result, coordinate position and rotation of wafer stage base 102 in X, Y, and $\theta_z$ has little effect on the relative position between exposure point 116 and focal point 118. The set of three high resolution sensors measures the relative distance in Z between three points on wafer stage base 102 and lens assembly 78. As shown in the equation below, the sensor measurements are s1, s2, and s3; while X, Y, and $\theta_z$ are treated as constants Cx, Cy, and C$\theta$z, respectively. The equation describes the sensor measurements as a function of wafer stage base 102 in Z, $\theta_x$, and $\theta_y$.

$$\begin{Bmatrix} s1 \\ s2 \\ s3 \end{Bmatrix} = \begin{bmatrix} 1 & Y7 & -X7 \\ 1 & Y8 & -X8 \\ 1 & Y9 & -X9 \end{bmatrix} \begin{Bmatrix} Z \\ \theta x \\ \theta y \end{Bmatrix} \quad \text{(Eq. 7)}$$

Thus, the above matrix is inversed to calculate position vector $r_6$ and coordinate rotation $$\begin{Bmatrix} Z \\ \theta x \\ \theta y \end{Bmatrix} = \begin{bmatrix} 1 & Y7 & -X7 \\ 1 & Y8 & -X8 \\ 1 & Y9 & -X9 \end{bmatrix}^{-1} \begin{Bmatrix} s1 \\ s2 \\ s3 \end{Bmatrix} \quad \text{(Eq. 8)}$$

$R_2$ based on sensor measurements s1, s2, and s3, as follows:

Therefore, the position vector $r_6$ and coordinate rotation $R_2$ are mathematically referred to as:

According to the third option, instead of treating the position of wafer stage base $$r_6 = \begin{Bmatrix} Cx \\ Cy \\ Z \end{Bmatrix} \quad \text{(Eq. 9)}$$

-continued $$R_2 = \begin{bmatrix} \theta_x \\ \theta_y \\ C_{\theta z} \end{bmatrix} \quad \text{(Eq. 10)}$$

102 in X, Y, and $\theta_z$ as constants, position sensors (not shown) which are parts of first and second vibration isolation systems, 122 and 124, respectively, can be used to calculate X, Y, and $\theta_z$ of wafer stage base 102 relative to lens assembly 78. The position sensors of first and second vibration isolation systems, 122 and 124, respectively, are generally attached to ground 82 or apparatus frame 72, which may be assumed to be rigid. Thus, such position sensors may be used to calculate the relative position between wafer stage base 102 and lens assembly 78. The matrix calculation for the third option is the same as Eq. 8 of the second option.

According to the fourth option, position vector $r_6$ and coordinate rotation $R_2$ can be represented by the following matrices:

Similar to the first option, the matrix calculation procedure to determine position vector $$r6 = \begin{Bmatrix} X \\ Y \\ Z \end{Bmatrix} \quad \text{(Eq. 11)}$$

$$R2 = \begin{bmatrix} 1 & -\theta z & \theta y \\ \theta z & 1 & -\theta x \\ -\theta y & \theta x & 1 \end{bmatrix} \quad \text{(Eq. 12)}$$

$r_6$ and coordinate rotation $R_2$ between wafer stage base 102 and lens assembly 78 is the same as formulae (3)–(6) previously described with respect to position vector $r_3$ and coordinate rotation $R_3$.

Figure 11:
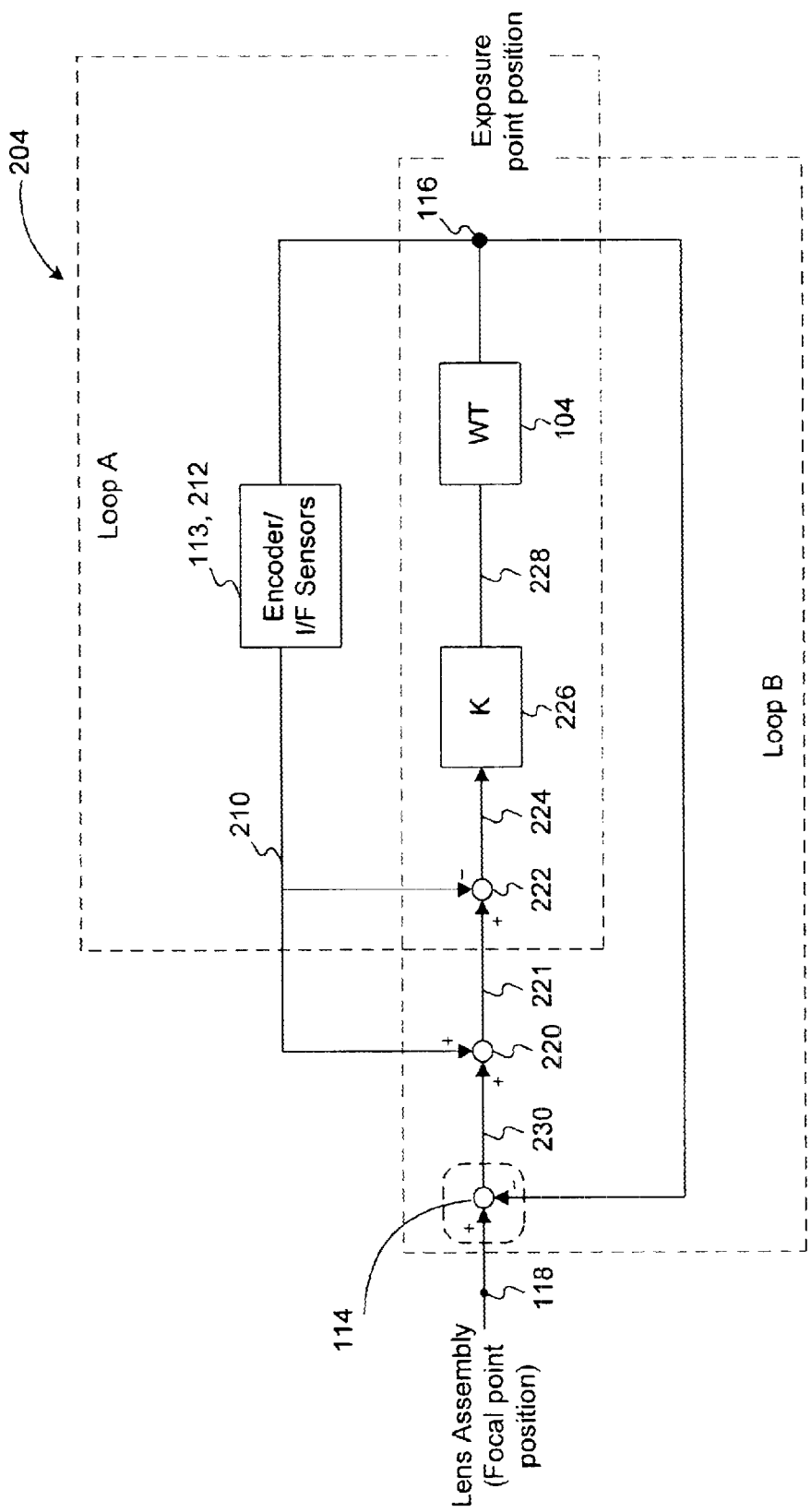
FIG. 11 is a block diagram of a wafer table servo control system consistent with the principles of the present invention.

Consistent with the principles of the present invention, and as illustrated in FIG. 11, a wafer table servo control system 204 is provided to operate wafer stage assembly 200 for automatically correcting a position error of wafer table 104 as determined by first sensor 113 and second sensor 114. Servo control system 204 includes a high-bandwidth loop A to control the position of the wafer table, using first position signal 210 from first sensor 113. Servo control system 204 also includes a loop B to generate the reference (target position) signal 221, which is the target position for loop A, based on second position signal 230 corresponding to vector $r_{PSD}$ as determined by second sensor 114.

In loop A, first sensor 113 may include a first sensor calculation 212, illustrated in FIG. 11 as being integrated with first sensor 113, to generate first position signal 210 corresponding to vector $r_7$ and representing a distance and rotation of exposure point 116 relative to projection lens system 78. Vector $r_7$ is an electronic sum of vector $r_6$ in coordinate frame $O_4$, vector $r_1$ in coordinate frame $O_2$, vector $r_3$ in coordinate frame $O_1$, and vector $r_4$ in coordinate frame $O_3$. The mathematical relation of vector $r_7$ can be expressed as follows:

$$r_7 = r_6 + R_2 r_1 + R_2 R_1 r_3 + R_2 R_1 R_3 r_4 \quad \text{(Eq. 13)}$$

First position signal 210 corresponding to vector $r_7$ is split to enter a first summing junction 220 and a second summing junction 222.

In loop B, second sensor 114 generates a second position signal 230 corresponding to vector $r_{PSD}$ and representing a position of focal point 118 of projection lens assembly 78 relative to exposure point 116 on wafer 68.

In loop B, first position signal 210 ($r_7$) and second position signal 230 ($r_{PSD}$) are combined at first summing junction 220 to generate a target position signal 221, corresponding to vector $r_5$ in FIG. 10. Vector $r_5$ represents a target or desired position of exposure point 116 relative to projection lens assembly 78. At second summing junction 222, exposure point target position signal 221 ($r_5$), assigned as having a positive value, is compared with first position signal 210 ($r_7$), assigned as having a negative value, to generate a position error signal 224 representing a position error of exposure point 116.

Wafer table servo control system 204 further includes a controller 226 to determine and generate a correction force 228 corresponding to position error signal 224 to be exerted onto wafer table 104 so that exposure point 116 on wafer 68 substantially coincides with focal point 118 of projection lens system 78. Force 228 may be generated by electromechanical type actuators such as a motor, an electromagnetic type actuators such as a transducer, or equivalents. In this embodiment, force 228 is generated by a set of three VCMs (voice coil motor 203 shown FIG. 5) that utilizes a Lorentz Force. Each VCM is disposed between wafer stage 66 and wafer table 104.

Figure 12:
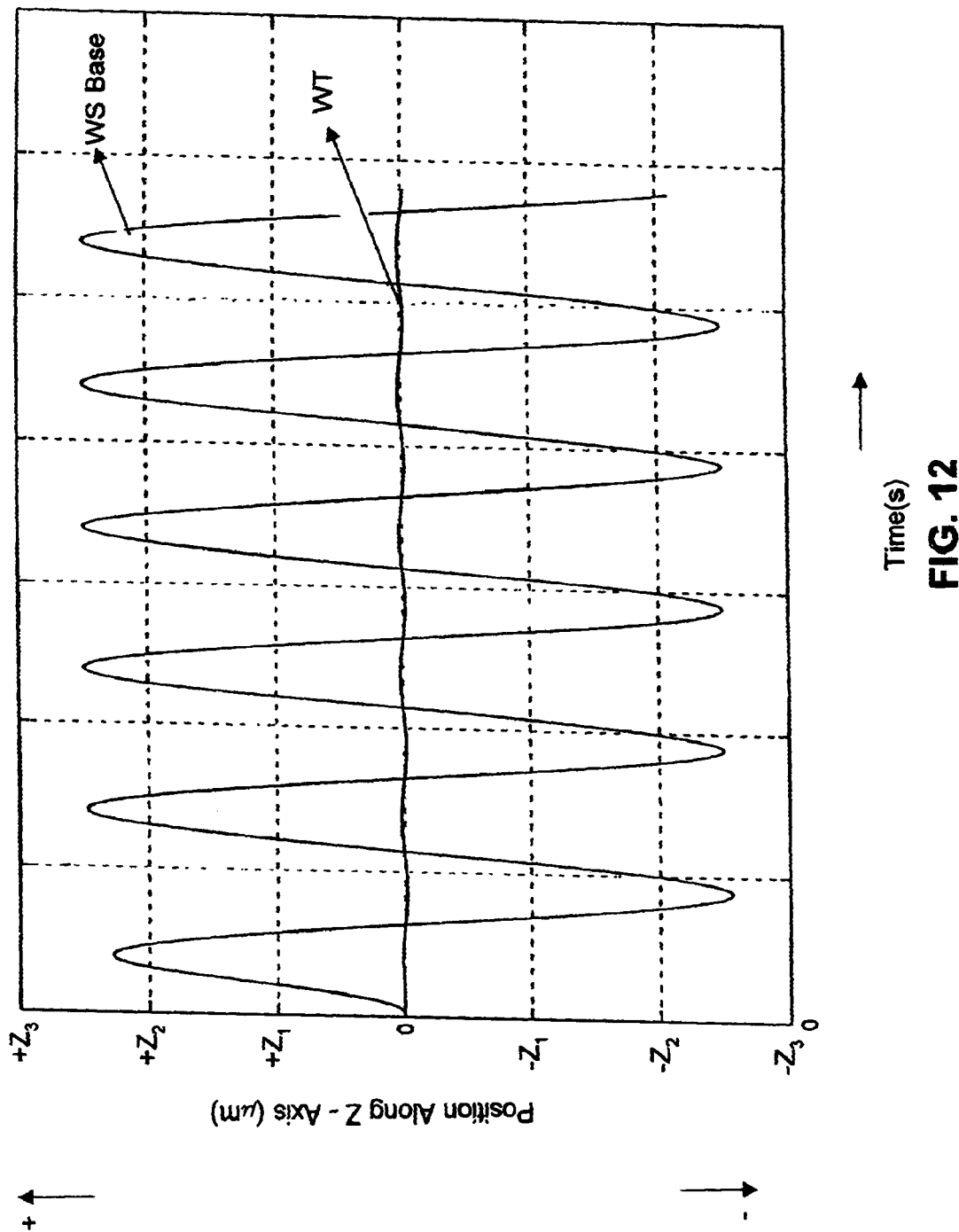
FIG. 12 is a chart of positions of a wafer table in response to an oscillating motion of a wafer stage base along the z axis, generated according to a simulation of a multi-body lithography structure with the wafer stage assembly consistent with the principles of the present invention.
Figure 13:
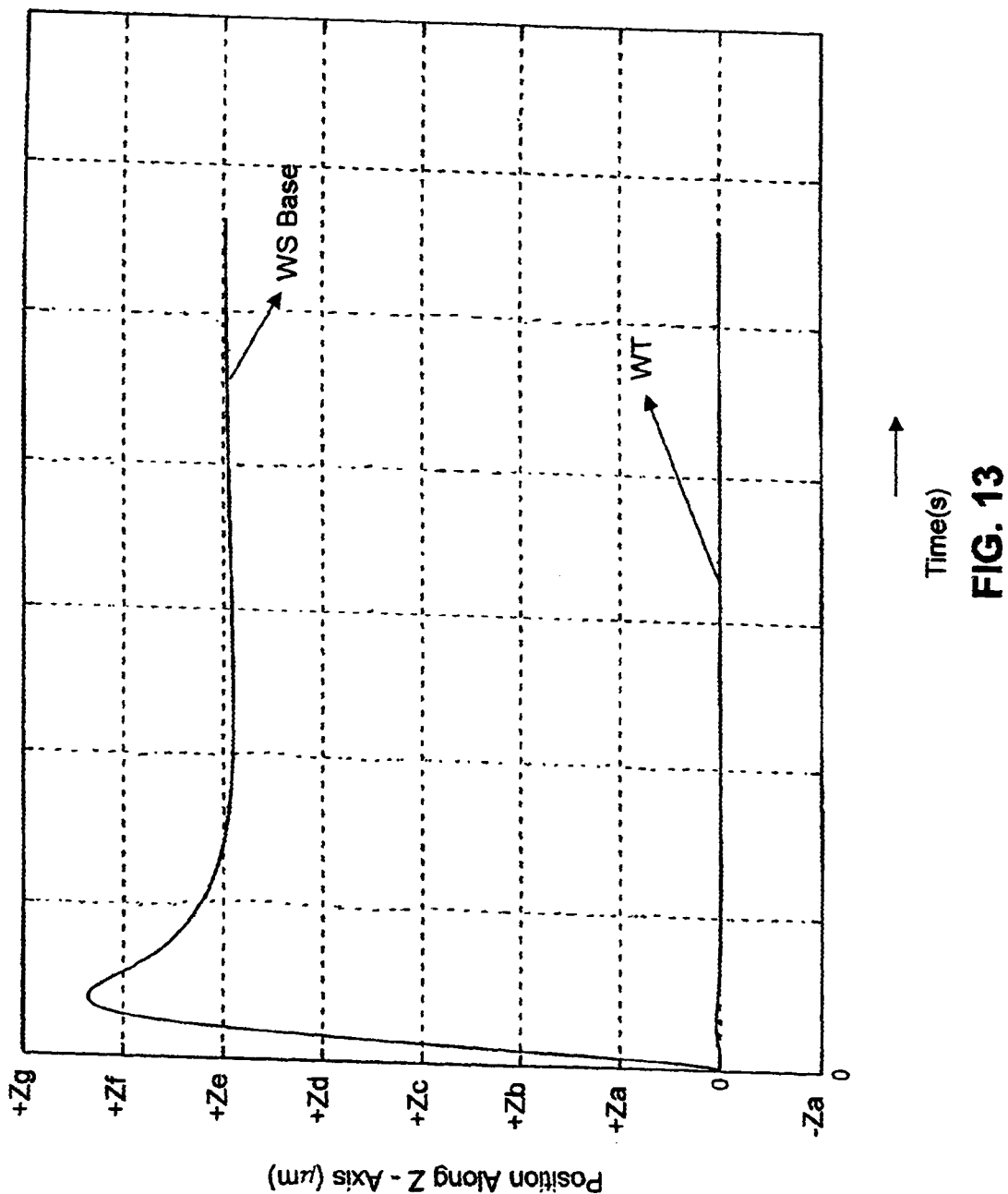
FIG. 13 is a chart of positions of a wafer table in response to a step motion of a wafer stage base along the z axis, generated according to a simulation of a multi-body lithography structure with the wafer stage assembly consistent with the principles of the present invention.

FIGS. 12 and 13 show the results of a simulation of a multi-body photolithography device employing the principles of the present invention, including wafer stage assembly 200 and servo control system 204. FIG. 12 represents the position of wafer table 104, along the z axis, in response to an oscillating motion of wafer stage base 102 measured in micrometers ($\mu$m) over a period of time in seconds (s). FIG. 13 represents the position of wafer table 104, along the z axis, in response to a step motion of wafer stage base 102 measured in micrometers ($\mu$m) over a period of time in seconds (s). As shown in FIGS. 12 and 13, the effects of oscillating and step motions of wafer stage base 102 on wafer table 104 are substantially reduced compared to those shown in FIGS. 6 and 7. Therefore, the position of exposure point 116 relative to projection lens system 78 can be accurately controlled.

Depending upon the design of exposure apparatus 21 either for a unibody or multi-body photolithography device, apparatus 21 can also include additional servo drive units, linear motors and planar motors to move wafer stage 66 and reticle stage 76. The use of exposure apparatus 21 provided herein is not limited to a photolithography system for a semiconductor manufacturing. Exposure apparatus 21, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Additionally, the present invention provided herein can be used in other devices, including other semiconductor processing equipment, machine tools, metal cutting machines, and inspection machines.

As shown in FIG. 5, illumination system 74 includes an illumination source 84 to emit a beam of light energy. Illumination system 74 also includes an illumination optical assembly 86 to guide the beam of light energy from illumination source 84 to lens assembly 78. The beam illuminates selectively different portions of reticle 80 and exposes wafer 68.

Lens assembly 78 projects and/or focuses the light passing through reticle 80 to wafer 68. Lens assembly 78 may magnify or reduce the image illuminated on reticle 80. Lens assembly 78 may also be a 1x magnification system.

Reticle stage 76 holds and positions reticle 80 relative to lens assembly 78 and wafer 68. Similarly, wafer stage 66 holds and positions wafer 68 with respect to the projected image of the illuminated portions of reticle 80. FIG. 5 shows that wafer stage 66 and reticle stage 76 are positioned by a plurality of motors 10.

The illumination source 84 can be g-line (436 nm), i-line (365 nm), KrF excimer laser (248 nm), ArF excimer laser (193 nm) and $F_2$ laser (157 nm). Alternatively, illumination source 84 can also use charged particle beams such as x-ray and electron beam. For instance, in the case where an electron beam is used, thermionic emission type lanthanum hexaboride ($LaB_6$) or tantalum (Ta) can be used as an electron gun. Furthermore, in the case where an electron beam is used, the structure could be such that either a mask is used or a pattern can be directly formed on a substrate without the use of a mask.

With respect to lens assembly 78, when far ultra-violet rays such as the excimer laser is used, glass materials such as quartz and fluorite that transmit far ultra-violet rays is preferably used. When the $F_2$ type laser or x-ray is used, lens assembly 78 should preferably be either catadioptric or refractive (a reticle should also preferably be a reflective type), and when an electron beam is used, electron optics should preferably comprise electron lenses and deflectors. The optical path for the electron beams should be in a vacuum.

Also, with an exposure device that employs vacuum ultra-violet radiation (VUV) of wavelength 200 nm or lower, use of the catadioptric type optical system can be considered. Examples of the catadioptric type of optical system include the disclosure Japan Patent Application Disclosure No. 8-171054 published in the Official Gazette for Laid-Open Patent Applications and its counterpart U.S. Pat. No. 5,668,672, as well as Japan Patent Application Disclosure No. 10-20195 and its counterpart U.S. Pat. No. 5,835,275. In these cases, the reflecting optical device can be a catadioptric optical system incorporating a beam splitter and concave mirror. Japan Patent Application Disclosure No. 8-334695 published in the Official Gazette for Laid-Open Patent Applications and its counterpart U.S. Pat. No. 5,689,377 as wall as Japan Patent Application Disclosure No. 10-3039 and its counterpart U.S. patent application Ser. No. 873,606 (Application Date: Jun. 12, 1997) also use a reflecting-refracting type of optical system incorporating a concave mirror, etc., but without a beam splitter, and can also be employed with this invention. The disclosures in the above-mentioned U.S. patents, as well as the Japan patent applications published in the Official Gazette for Laid-Open Patent Applications are incorporated herein by reference.

Further, in photolithography systems, when linear motors (see U.S. Pat. No. 5,623,853 or U.S. Pat. No. 5,528,118) are used in a wafer stage or a reticle stage, the linear motors can be either an air levitation type employing air bearings or a magnetic levitation type using Lorentz force or reactance force. Additionally, the stage could move along a guide, or it could be a guideless type stage which uses no guide. The disclosures in U.S. Pat. Nos. 5,623,853 and 5,528,118 are incorporated herein by reference.

Alternatively, one of the stages could be driven by a planar motor, which drives the stage by electromagnetic force generated by a magnet unit having two-dimensionally arranged magnets and an armature coil unit having two-dimensionally arranged coils in facing positions. With this type of driving system, either one of the magnet unit or the armature coil unit is connected to the stage and the other unit is mounted on the moving plane side of the stage.

Movement of the stages as described above generates reaction forces which can affect performance of the photolithography system. Reaction forces generated by the wafer (substrate) stage motion can be mechanically released to the floor (ground) by use of a frame member as described in U.S. Pat. No. 5,528,118 and published Japanese Patent Application Disclosure No. 8-166475. Additionally, reaction forces generated by the reticle (mask) stage motion can be mechanically released to the floor (ground) by use of a frame member as described in U.S. Pat. No. 5,874,820 and published Japanese Patent Application Disclosure No. 8-330224. The disclosures in U.S. Pat. Nos. 5,528,118 and 5,874,820 and Japanese Patent Application Disclosure No. 8-330224 are incorporated herein by reference.

As described above, a photolithography system according to the above described embodiments can be built by assembling various subsystems, including each element listed in the appended claims, in such a manner that prescribed mechanical accuracy, electrical accuracy and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, total adjustment is performed to make sure that every accuracy is maintained in the complete photolithography system. Additionally, it is desirable to manufacture an exposure system in a clean room where the temperature and purity are controlled.

Further, semiconductor devices can be fabricated using the above described systems, by the process shown generally in FIG. 13. In step 301 the device's function and performance characteristics are designed. Next, in step 302, a mask (reticle) having a pattern is designed according to the previous designing step, and in a parallel step 303, a wafer is made from a silicon material. The mask pattern designed in step 302 is exposed onto the wafer from step 303 in step 304 by a photolithography system described hereinabove consistent with the principles of the present invention. In step 306 the semiconductor device is assembled (including the dicing process, bonding process and packaging process), then finally the device is inspected in step 306.

Figure 14:
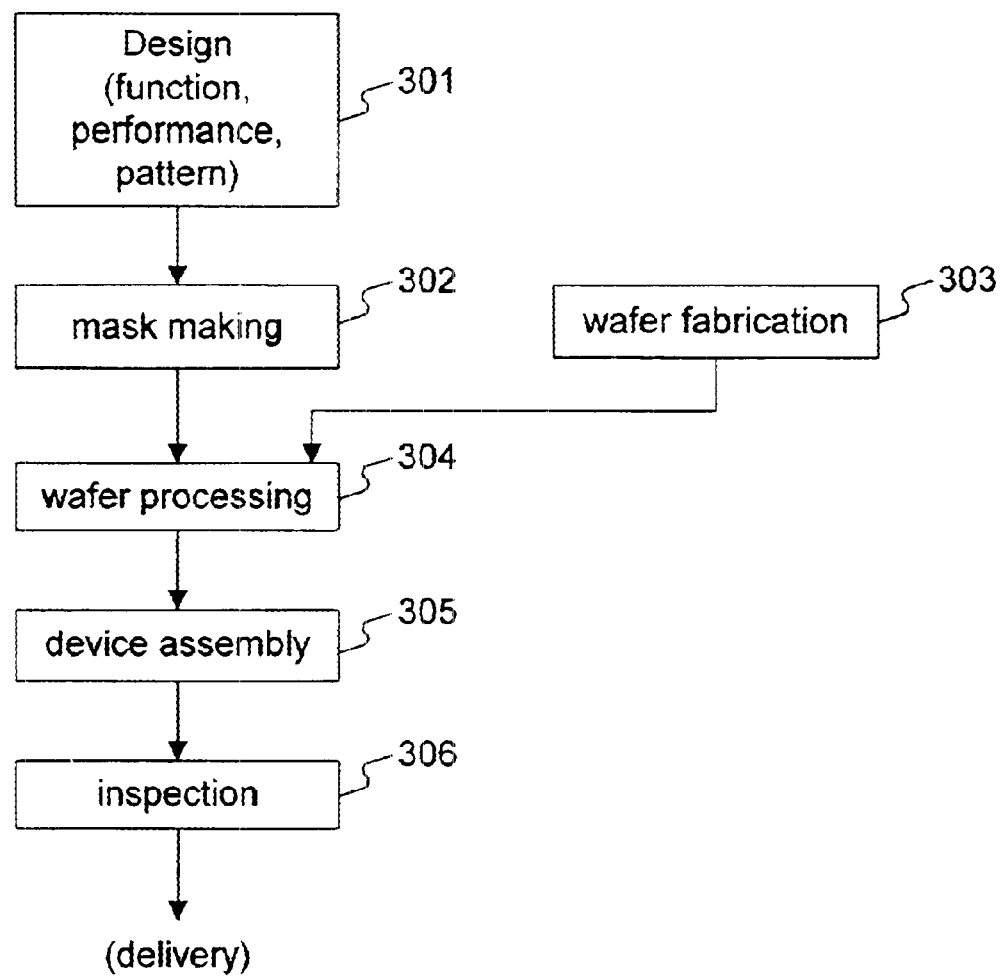
FIG. 14 is a flow chart outlining a process for manufacturing an apparatus in accordance with the present invention.
Figure 15:
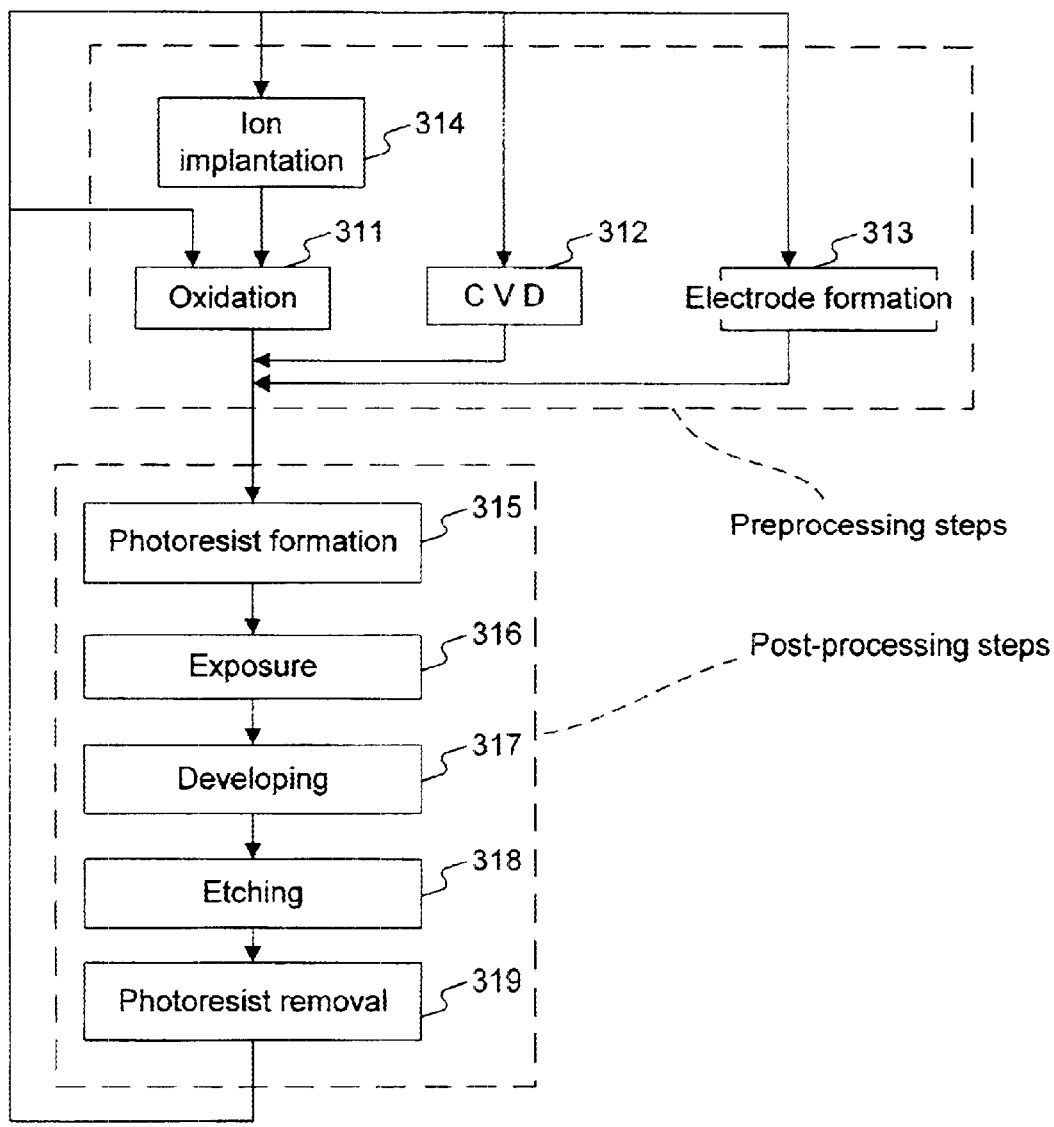
FIG. 15 is a flow chart outlining an apparatus processing in more detail.

FIG. 14 illustrates a detailed flowchart example of the above-mentioned step 304 in the case of fabricating semiconductor devices. In step 311 (oxidation step), the wafer surface is oxidized. In step 312 (CVD step), an insulation film is formed on the wafer surface. In step 313 (electrode formation step), electrodes are formed on the wafer by vapor deposition. In step 314 (ion implantation step), ions are implanted In the wafer. The above mentioned steps 311–314 form the preprocessing steps for wafers during wafer processing, and selection is made at each step according to processing requirements.

At each stage of wafer processing, when the above-mentioned preprocessing steps have been completed, the following post-processing steps are implemented. During post-processing, initially, in step 315 (photoresist formation step), photoresist is applied to a wafer. Next, in step 316, (exposure step), the above-mentioned exposure device is used to transfer the circuit pattern of a mask (reticle) to a wafer. Then, in step 317 (developing step), the exposed wafer is developed, and in step 318 (etching step), parts other than residual photoresist (exposed material surface) are removed by etching. In step 319 (photoresist removal step), unnecessary photoresist remaining after etching is removed.

Multiple circuit patterns are formed by repetition of these preprocessing and post-processing steps.

It will be apparent to those skilled in the art that various modifications and variations can be made in the methods described, in the stage device, the control system, the material chosen for the present invention, and in construction of the photolithography systems as well as other aspects of the invention without departing from the scope or spirit of the invention.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims and their equivalents.

We claim:

1. A stage assembly for use in combination with a projection optical assembly in a photolithography process for processing a substrate, comprising:
   a stage that positions the substrate;
   a stage base that supports the stage;
   a table connected to the stage to support the substrate;
   a first sensor that determines a position of an exposure point on the table relative to the projection optical assembly, wherein the first sensor comprises:
      a first sub-sensor to determine a position of the stage base relative to the projection optical assembly; and
      a second sub-sensor to determine a position of the table relative to the stage;
   a second sensor that determines a position of a focal point of the projection optical assembly relative to the exposure point; and
   an actuator that moves the table so that the exposure point substantially coincides with the focal point.

2. The stage assembly of claim 1, wherein the first sub-sensor is at least one interferometer to determine a distance and rotation of the stage base relative to the projection optical system.

3. The stage assembly of claim 1, wherein the second sub-sensor is at least one encoder to determine a distance and rotation of the table relative to the stage.

4. The stage assembly of claim 1, wherein the first sensor further comprises:
   a first input controller to generate a first input position of the stage relative to the stage base; and
   a second input controller to generate a second input position of the exposure point relative to the table.

5. The stage assembly of claim 4, wherein the first input position is a first known value.

6. The stage assembly of claim 4, wherein the second input controller is a second known value.

7. The stage assembly of claim 1, wherein the second sensor is an auto-focus and auto-leveling sensor.

8. The stage assembly of claim 1, further comprising:
   a set of flexures connected to the stage to support the table.

9. The stage assembly of claim 1, further comprising:
   a bearing separating the stage from the stage base, the bearing being connected to the remote source to provide the input corresponding to the position of the stage relative to the stage base.

10. The stage assembly of claim 9, wherein the bearing comprises a pressurized fluid.

11. The stage assembly of claim 1, further comprising:
    a first vibration isolation system to support the projection optical system; and
    a second vibration isolation system to support the stage base.

12. A lithography system comprising a stage assembly as claimed in claim 1.

13. An object in which an image has been formed by the lithography system of claim 12.

14. A method for determining a position of a table relative to a projection optical assembly in a semiconductor substrate manufacturing device, the table being supported by a stage and a stage base, comprising the steps of:
    determining a position of the stage base relative to the projection optical assembly;
    determining a position of the stage relative to the stage base; and
    determining a position of the table relative to the stage.

15. The method of claim 14, wherein the step of determining a position of the stage base comprises:
    using a first sensor to measure a distance and rotation of the stage base relative to the projection optical assembly.

16. The method of claim 15, wherein the first sensor includes at least one interferometer.

17. The method of claim 14, wherein the step of determining a position of the table comprises:
    using a second sensor to measure a distance and rotation of the table relative to the stage.

18. The method of claim 17, wherein the second sensor includes at least one encoder.

19. The method of claim 14, wherein the step of determining a position of the stage comprises:
    inputting a distance and rotation of the stage relative to the stage base from a remote source.

20. The method of claim 14, wherein the step of determining a position of the exposure point comprises:
    inputting a distance and rotation of the exposure point relative to the table from the remote source.

21. The method of claim 14, further comprising the further steps of:
    determining a position of an exposure point on the substrate relative to the table; and
    determining a distance and rotation of the exposure point of the projection optical assembly relative to the position of the exposure point.

22. The method of claim 21, wherein the step of determining a position of a focal point further comprises:
    using a third sensor to measure a distance and rotation of the focal point relative to the exposure point.

23. The method of claim 22, wherein the third sensor includes an auto-focus and auto-leveling sensor.

24. A method of operating an exposure apparatus to form an image onto a substrate utilizing a projection optical assembly, the substrate is supported by a table that is connected to a stage supported by a stage base, the method comprising the steps of:
    determining a position of the table relative to the projection optical assembly by utilizing the method of claim 14; and
    irradiating the substrate with radiation to form the image on the substrate by the projection optical assembly.

25. A method for making an object including at least the photolithography process, wherein the photolithography process utilizes the method of operating an exposure apparatus of claim 24.

26. A table servo control system of a stage assembly having a stage base for supporting a stage and positioning a semiconductor substrate, a table connected to the stage for supporting the substrate, comprising:

a first sensor controller to generate a first position signal of an exposure point on the table relative to a projection optical assembly, wherein the first sensor controller comprises:

a first sub-sensor to generate a first sub-position signal of the stage base relative to the projection optical assembly;

a first input controller to input a first input position signal of the stage relative to the stage base;

a second sub-sensor controller to generate a second sub-position signal of the table relative to the stage; and a second input controller to generate a second input position signal of the exposure point relative to the table;

a second sensor controller to generate a second position signal of a focal point of the projection optical assembly relative to the exposure point; and a table controller to determine a correction force corresponding to the first and second position signals, the correction force being exerted on the table to bring the exposure point to substantially coincide with the focal point.

27. The table servo control system of claim 26, wherein the first sensor controller further comprises:

a first sensor controller to generate the first position signal corresponding to a sum of the first sub-position signal, the first input position signal of the stage relative to the stage base, the second sub-position signal of the table relative to the stage, and the second input position signal of the exposure point relative to the table.

28. The table servo control system of claim 26, wherein the first sub-sensor comprises at least one interferometer sensor to measure a distance and a rotation of the stage base relative to the projection optical assembly.

29. The table servo control system of claim 26, wherein the second sub-sensor comprises at least one encoder to measure a distance and a rotation of the table relative to the stage.

30. The table servo control system of claim 26, wherein the second sensor comprises an auto-focus and auto-leveling sensor.

31. The table servo control system of claim 26, wherein the table controller comprises:

a first summing junction to combine the first position signal and the second position signal, and generate an exposure point desired position signal;

a second summing junction to compare the exposure point desired position signal with the first position signal, and generate an exposure point position error signal; and an actuator to determine the correction force corresponding to the exposure point position error signal.

32. A lithography system comprising a table servo control system as claimed in claim 26.

33. An object in which an image has been formed by the lithography system of claim 32.

34. A method for operating a table servo control system of a stage assembly, comprising the steps of:

creating a first loop to generate a first position signal of an exposure point on a table relative a projection optical system, wherein the step of creating a first loop comprises:

generating a first position signal of a stage base relative to the projection optical system;

generating a second position signal of a stage relative to the stage base;

generating a third position signal of a table relative to the stage; and generating a fourth position signal of the exposure point relative to the table;

creating a second loop to generate a second position signal of a focal point of the projection optical system relative to the exposure point; and exerting a correction force, in response to the first and second position signals, onto the table to bring the exposure point to substantially coincide with the focal point.

35. The method of claim 34, wherein the step of creating a second loop comprises:

generating a fifth position signal of the focal point relative to the exposure point.

36. The method of claim 35, wherein the step of exerting a correction force comprises:

combining the first, second, third, and fourth position signals to generate an exposure point position signal;

combining the fifth position signal and the exposure point position signal to generate an exposure point desired position signal;

comparing the exposure point desired position signal with the exposure point position signal to generate an exposure point position error signal; and generating the correction force corresponding to the exposure point position error signal.

37. A method of operating an exposure apparatus to form an image onto a substrate utilizing a projection optical system, the substrate is supported by a table that is connected to a stage supported by a stage base, the method comprising the steps of:

determining a position of the table relative to the projection optical system by utilizing the method of claim 34; and irradiating the substrate with radiation to form the image on the substrate by the projection optical system.

38. A method for making an object including at least the photolithography process, wherein the photolithography process utilizes the method of operating an exposure apparatus of claim 37.

* * * * *

UNITED STATES PATENT AND TRADEMARK OFFICE
CERTIFICATE OF CORRECTION

PATENT NO. : 6,686,991 B1
DATED : February 3, 2004
INVENTOR(S) : Michael Binnard et al.

It is certified that error appears in the above-identified patent and that said Letters Patent is hereby corrected as shown below:

Column 16,
Line 40, "claim 14," should read -- claim 19, --.

Signed and Sealed this

Thirteenth Day of April, 2004

JON W. DUDAS
*Acting Director of the United States Patent and Trademark Office*